United States Patent
Dasasathyan et al.

(10) Patent No.: US 7,149,994 B1
(45) Date of Patent: Dec. 12, 2006

(54) INTEGRATED CLOCK AND INPUT OUTPUT PLACER

(75) Inventors: Srinivasan Dasasathyan, Sunnyvale, CA (US); Qiang Wang, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 183 days.

(21) Appl. No.: 10/651,786

(22) Filed: Aug. 29, 2003

(51) Int. Cl.
*G06F 17/50* (2006.01)

(52) U.S. Cl. ............................................. 716/10; 716/2

(58) Field of Classification Search ................... 716/2, 716/5–6, 8–13; 326/93; 327/293, 375; 345/440
See application file for complete search history.

(56) References Cited

U.S. PATENT DOCUMENTS

| | | | |
|---|---|---|---|
| 4,495,559 A * | 1/1985 | Gelatt et al. ................... 700/28 |
| 5,757,658 A * | 5/1998 | Rodman et al. ............... 716/10 |
| 5,917,729 A * | 6/1999 | Naganuma et al. ........... 716/10 |
| 6,111,448 A * | 8/2000 | Shibayama ................. 327/293 |
| 6,442,743 B1 * | 8/2002 | Sarrafzadeh et al. .......... 716/10 |
| 6,513,149 B1 * | 1/2003 | Donato ........................ 716/12 |
| 6,578,183 B1 * | 6/2003 | Cheong et al. ................. 716/7 |
| 6,583,648 B1 * | 6/2003 | Cai .............................. 326/93 |
| 6,789,244 B1 | 9/2004 | Dasasathyan et al. |
| 6,851,099 B1 * | 2/2005 | Sarrafzadeh et al. .......... 716/10 |
| 6,865,726 B1 * | 3/2005 | Igusa et al. ................... 716/18 |
| 6,871,328 B1 * | 3/2005 | Fung et al. ..................... 716/1 |
| 2003/0222872 A1 * | 12/2003 | Lin et al. ..................... 345/440 |

OTHER PUBLICATIONS

S. Kirkpatrick, C. D. Gelatt, Jr., M. P. Vecchi; "Optimization by Simulated Annealing"; Science; May 13, 1983, vol. 200, No. 4598; pp. 671-680.

Emi Eto et al.; "Local Clocking Resources in Virtex-II Devices"; XAPP609 (v1.0) Jan. 23, 2003; available from Xilinx, Inc. at www.xilinx.com; pp. 1-14.

Xilinx, Inc.; Virtex-II Platform FPGA Handbook; "Using Global Clock Networks"; available from Xilinx, Inc. at www.xilinx.com; pp. 142-160, Dec. 2000.

\* cited by examiner

*Primary Examiner*—Vuthe Siek
(74) *Attorney, Agent, or Firm*—Pablo Meles; LeRoy D. Maunu; Kim Kanzaki

(57) ABSTRACT

A method (200) of placing inputs, outputs, and clocks in a circuit design can include assigning (205) initial locations to inputs and outputs of the circuit design, selecting (210) at least one component type for the circuit design, and generating (215) a cost function having parameters corresponding to the selected component type. The method further can include annealing (220) the selected component type using the cost function and determining design constraints (225) for the selected component type according to the annealing step. The method can repeat to process additional component types such that design constraints determined for each additional component type do not violate design constraints determined for prior component types.

38 Claims, 2 Drawing Sheets

INTEGRATED CLOCK AND INPUT OUTPUT PLACER

BACKGROUND

1. Field of the Invention

This invention relates to the field of physical circuit design and, more particularly, to the placement of a design.

2. Description of the Related Art

Designs for Field Programmable Gate Arrays (FPGA's) have become increasingly complex and heterogeneous. Modern FPGA designs can include a variety of different components or resources including, but not limited to, block random access memory (RAM), multipliers, processors, and the like. This increasing complexity makes placement of circuit design components more cumbersome.

Components of circuit designs traditionally have been placed through a series of discrete phases or tasks. Each task is performed sequentially and independently of the others. More particularly, for a given circuit design, a general placement is first performed. The general placement assigns locations on the physical circuit design or chip to inputs and outputs (I/O's).

After the general placement, the I/O assignments are analyzed and relocated as necessary to ensure that the I/O's conform with select I/O standards. The select I/O standards ensure that I/O's located on a same bank of the physical circuit design do not conflict with one another.

The I/O's of a FPGA device can be configured to conform to any one of a variety of different I/O standards. Not all of these standards, however, are compatible with one another. To avoid incompatibility issues, the I/O's of a FPGA circuit design are arranged in groupings called banks. While banks can vary from one circuit design to another, typically, banks span approximately one-half the length of an edge of a chip. Accordingly, a conventional rectangular chip can include 8 banks of I/O's, 2 per side. The I/O's within each bank must conform to I/O standards that are compatible with one another.

After the I/O's are placed, local clock sources can be assigned to physical locations on the circuit design. While the task of placing the local clock sources begins after the placement of the I/O's, the task operates in an independent manner. In other words, the local clock placement task operates without any knowledge of I/O assignments or design constraints determined during the general I/O placement task or the select I/O placement task.

The local clock source placement task seeks to control or minimize clock skew and clock signal delay by assigning local clock sources to particular physical locations within the circuit design. Once the local clock sources are assigned to locations, the loads of the local clock sources of the circuit design can be constrained. The circuit design can be divided into one or more areas often referred to as windows. As such, the loads for each local clock source can be assigned to a particular window as dictated by predetermined design constraints for minimizing clock skew and clock signal delay.

Finally, the global clock sources can be assigned to physical locations on the circuit design. Like the other placement tasks, the global clock placement task begins executing without any knowledge of the placement of I/O's or local clock sources. Once the global clock sources are assigned to locations, the loads of the global clock sources can be assigned to windows of the circuit design.

This placement strategy, however, fails to acknowledge the interdependencies of each respective placement task. That is, while a proper placement may be determined after the I/O's are placed, the subsequent task of placing local clock sources may lead to an improper or illegal circuit placement with respect to design constraints developed for the I/O's during the I/O placement task. In other words, the placement developed by the local clock placement task may disregard requirements determined by the I/O placement task, for example by locating incompatible I/O's within the same bank. Similarly, the global clock placement task may determine location assignments for the global clocks which disregard design constraints determined for the local clocks.

Despite the fact that each placement task influences the other placement tasks, each is performed without incorporating any knowledge of design constraints determined in prior tasks. What is needed is a technique in which design constraints and placement information determined during each individual placement task can be utilized and incorporated in subsequent placement tasks.

SUMMARY OF THE INVENTION

Various embodiments of the present invention provide a solution for placing inputs and outputs (I/O) as well as various clock sources. Rather than placing I/O, local clock sources and loads, and global clock sources and loads independently of one another, the interdependencies between each task are recognized and the components placed together. One embodiment of the present invention can place I/O's, local clock sources and loads, and global clock sources and loads simultaneously.

In another embodiment, the various circuit design components can be placed through a series of tasks which operate in cooperation with one another. As design constraints are determined, those constraints can be provided in a feed-forward manner to successive placement tasks. That is, design constraints determined during the placement of local clock sources and I/O's can be used during the next placement task, in this case placing global clock sources. The resulting final placement of the circuit design conforms to design constraints for each of the successive placement tasks.

One embodiment of the present invention can include a method of placing a circuit design. The method can include assigning initial locations to inputs and outputs of the circuit design, selecting at least one component type for the circuit design, generating a cost function having parameters corresponding to the selected component type, annealing the selected component type using the cost function, and determining design constraints for the selected component type according to the annealing step. The above steps can be repeated for additional component types such that design constraints determined for each additional component type do not violate design constraints determined for prior component types.

The component types to be selected can include inputs and outputs, local clock sources, and global clock sources. A component type selection indicating inputs and outputs and local clock sources can be received. Accordingly, the step of annealing can include the step of assigning individual I/O's to banks of the circuit design and assigning locations to the local clock sources. The step of determining design constraints can include constraining loads of local clock sources to windows of the circuit design.

The additional component types can include global clock sources. As such, the annealing step can include the step of assigning locations to global clock sources. The step of determining design constraints can include the step of constraining loads of global clock sources to windows of the circuit design.

Another embodiment of the present invention can include a method of placing a circuit design including assigning initial locations to inputs and outputs of the circuit design, selecting at least two different component types for the circuit design, generating a cost function having parameters corresponding to each selected component type, annealing the selected component types of the circuit design simultaneously using the cost function, and determining design constraints for the circuit design according to the annealing step.

The selecting step can include selecting I/O's, local clock sources, and global clock sources. Accordingly, the annealing step can include assigning each individual I/O to a bank of the circuit design, assigning locations to local clock sources, and assigning locations to global clock sources. The determining step can include constraining loads of local clock sources to windows of the circuit design and constraining loads of global clock sources to windows of the circuit design.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Embodiments of the present invention provide a method, system, and apparatus for placing inputs and outputs (I/O's) and clock resources for circuit designs. In accordance with one embodiment of the present invention, as design constraints are determined by individual placement tasks, the design constraints are communicated to subsequent placement tasks. Each placement task executes with the benefit of knowing the design constraints determined from previous placement tasks and builds upon those design constraints.

In accordance with the inventive arrangements disclosed herein, clocks and I/O's are placed and loads of the clocks are constrained to portions of the circuit design. A detailed placement can be used in cooperation with an embodiment of the present invention to place remaining circuit logic. The resulting placement of the circuit design conforms to the design constraints for each individual task. In another embodiment, one or more placement tasks can be combined such that more than one type of circuit component is placed simultaneously. In either case, the circuit design can be placed in a manner that recognizes the interdependencies of placing different types of circuit components.

Figure 1:
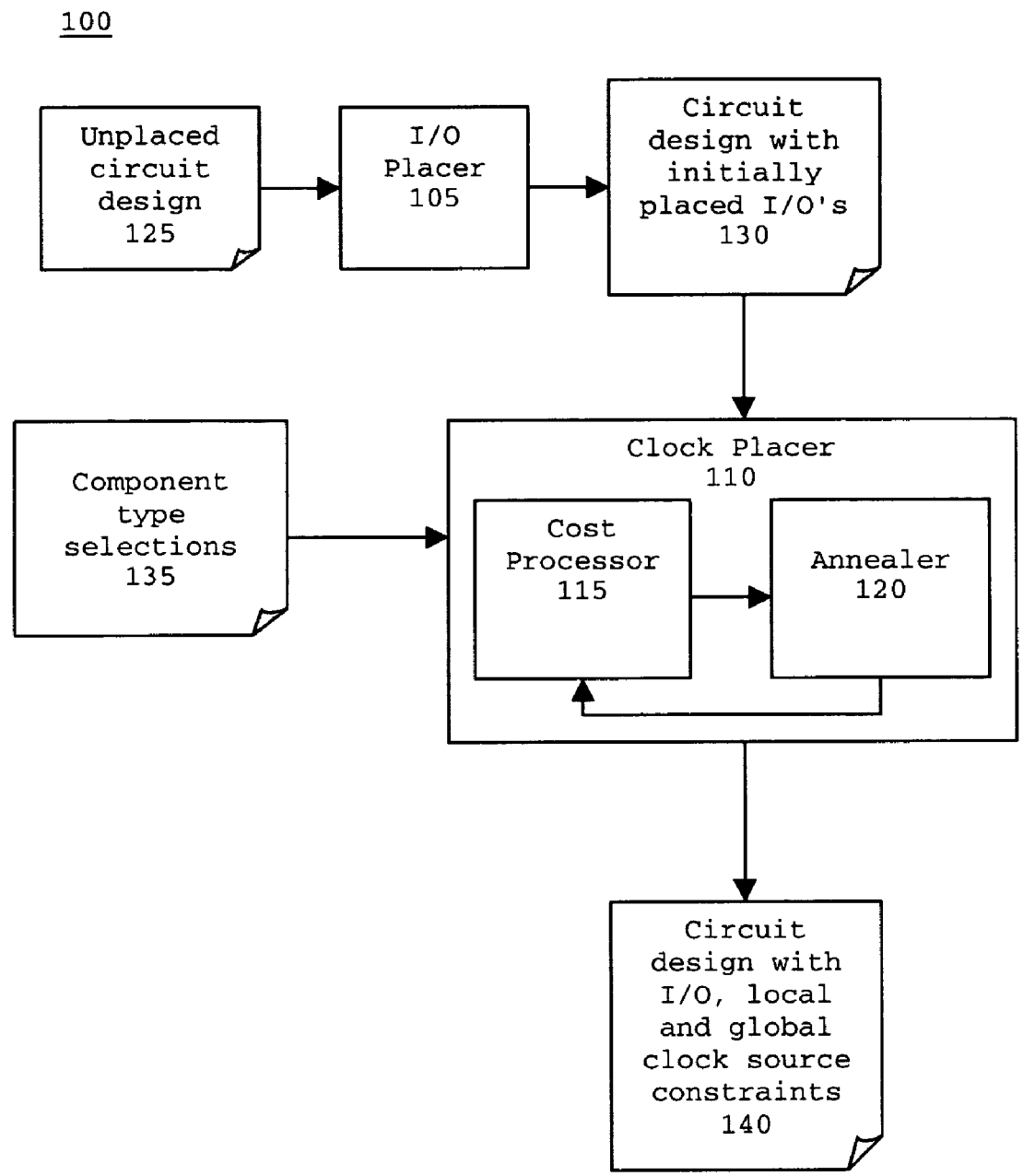
FIG. 1 is a schematic diagram illustrating a system for placing components of a circuit design in accordance with one embodiment of the present invention.

FIG. 1 is a schematic diagram illustrating a system 100 for placing components of a circuit design in accordance with one embodiment of the present invention. As shown, the system 100 can include an I/O placer 105 and a clock placer 110. The I/O placer 105 is a software component or application that determines an initial placement of I/O for the circuit design. The I/O placer 105 assigns physical locations on the chip to the circuit I/O thereby associating circuit I/O's with physical circuit pins.

According to one embodiment of the present invention, the I/O placer 105 assigns locations to circuit I/O's without regard to whether each particular I/O is located in a bank with other compatible I/O's. As such, the initial placement of the circuit I/O's may be illegal in that one or more incompatible I/O standards are being utilized within the same bank of the circuit design. In other words, the initial I/O placement determined by the I/O placer 105 may not be compliant with select I/O standards.

The clock placer 110 is a software component or application that determines initial placements of local and global clock sources. The clock placer 110 also operates upon the initial placements to systematically determine a final placement for I/O's, local clock sources and loads, as well as global clock sources and loads. As shown, the clock placer 110 includes a cost processor 115 and an annealer 120. The cost processor 115 models predetermined input timing requirements and other placement constraints as cost functions which are used to determine the quality of placement decisions made during the annealing process. The cost processor 115 computes any of several different cost functions depending upon the placement task at hand.

In the case of placing I/O's in conformance with select I/O standards, the cost function penalizes component movements that violate these standards. With respect to local clock sources, the cost function penalizes movements which lead to the local clock nets having too high of a skew or delay as specified by predetermined design specifications or tolerances. With respect to global clock sources, the cost function penalizes component movements that violate any previously determined constraints as well as predetermined global clock placement rules.

The annealer 120 determines placement solutions for selected circuit components by implementing a simulated annealing process. The simulated annealing process is one variety of stochastic hill-climber algorithm inspired through an analogy with the cooling of metals. The simulated annealing process is disclosed by S. Kirkpatrick, C. D. Gelatt, and M. P. Vecchi: "Optimization by simulated annealing", Science, vol. 220, no. 4598, pp. 671–680 (May 13, 1983), which is fully incorporated herein by reference.

The annealing process implemented by the annealer 120 begins with a simulated high temperature and begins randomly generating placement solutions by swapping the position of two or more components such as I/O's, local clock sources, or global clock sources. After each component swap or iteration, the annealer 120 access the cost processor 115 to recalculate the relevant cost function to evaluate the proposed solution. If the cost function decreases, indicating that the proposed solution has improved over the last iteration, the solution can be accepted as the current solution and used as a basis for subsequent annealing iterations. If, however, the cost function increases, the solution may or may not be accepted. Specifically, placement solutions producing increasing cost functions can be accepted as the current solution, but also be assigned a probability that is dependent upon the current value of the temperature.

The probability of accepting a proposed solution showing an increase in a cost function decreases as the temperature decreases during the annealing process. The annealing process incorporates a cooling schedule, or rate of decrease of temperature, such that at high temperatures, almost any proposed placement solution is accepted. Accordingly, at high temperatures, the annealer 120 stresses the exploration of different placement solutions. At lower temperatures, the probability of accepting a solution in which the cost function increases is lessened. Thus, at lower temperatures, the annealer 120 stresses exploitation of placement solutions under development and converges to a solution.

In operation, an unplaced circuit design 125 can be provided to the I/O placer 105. The I/O placer 105 can assign initial locations to I/O's for the circuit design. The circuit design with initially placed I/O's 130 then can be provided to the clock placer 110.

In one embodiment of the present invention, the clock placer 110 can simultaneously place the I/O's, local clock sources, as well as global clock sources. In another embodiment, the placement component 110 can operate on a grouping of one or more component types and then operate on subsequent groupings of component types until the circuit design is placed. The determination of which component types the clock placer 110 will operate upon simultaneously can be determined by the component type selections 135 as specified by a circuit designer.

Accordingly, the clock placer 110 can determine final placements for the I/O's, local clock sources, and global clock sources, simultaneously, independently, or in various combinations as specified by the component type selections 135. The circuit design with I/O, local and global clock source constraints 140 can be provided as output. In the case where each component type is operated upon simultaneously by the clock placer 110, the placement constraints determined will conform to the placement constraints for each respective component type. If component types are placed individually or in groupings, the design constraints determined by each iteration of the annealing process can be used as a baseline for performing the annealing process on subsequent components to be placed.

Those skilled in the art will recognize that the present invention is not limited by the particular software configuration or architecture used. For example, while the system 100 is depicted as having two components, according to another embodiment, the components can be combined into a single and more complex program. According to another embodiment, each of the various tasks described herein can be implemented using one or more individual software components or applications.

Figure 2:
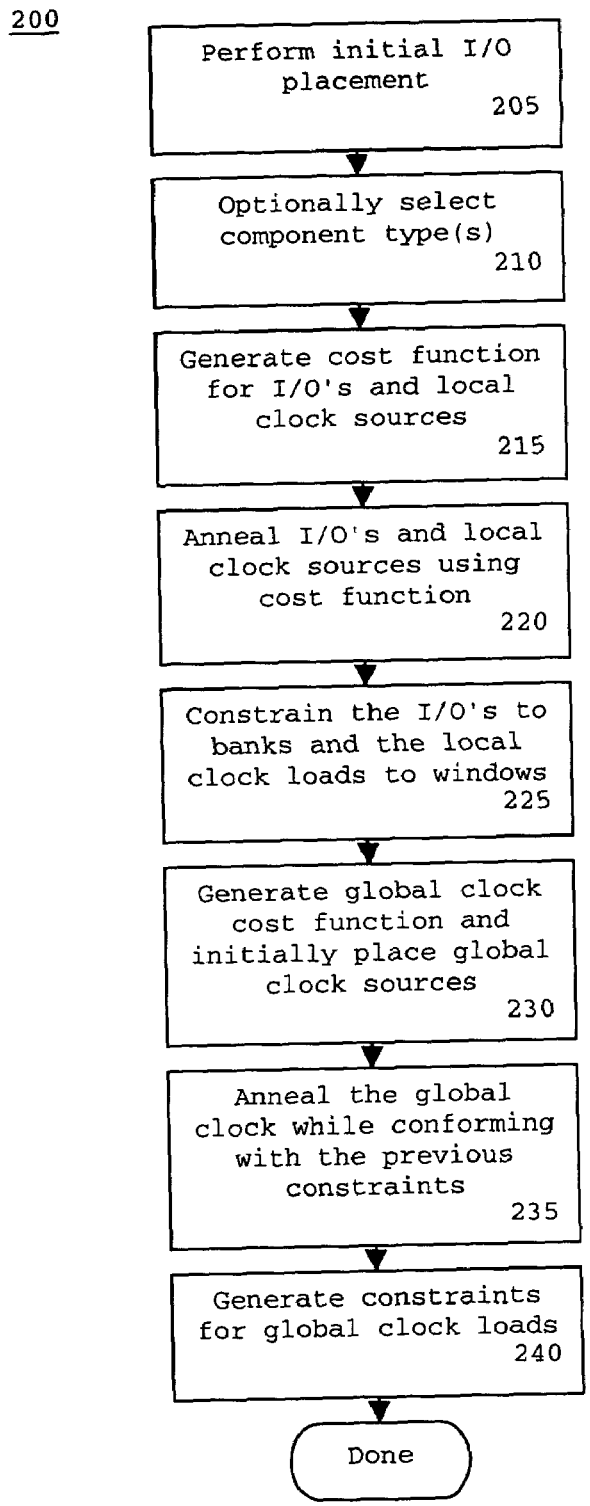
FIG. 2 is a flow chart illustrating a method of placing a circuit design in accordance with another embodiment of the present invention.

FIG. 2 is a flow chart illustrating a method 200 of placing a circuit design in accordance with one embodiment of the present invention. The method 200 can begin in step 205 where an initial placement of the I/O's of the circuit design can be performed. More particularly, the I/O's of the circuit design can be initially assigned to banks of the circuit design.

In step 210, a designer selection indicating which component types are to be operated upon simultaneously can be received. While all component types such as I/O's, local clock sources, and global clock sources can be operated upon at the same time during the annealing process, those skilled in the art will recognize that such a processing task can be overly time consuming.

Accordingly, a designer can specify that each placement task is to be performed separately such that as placement constraints are determined by each respective task, those constraints are provided to the next placement task in feed-forward fashion to be used as a baseline for performing the next placement task. Alternatively, the design selection can specify that more than one task such as select I/O determinations and local clock source assignments should be performed simultaneously. In that case, placement constraints determined during the combined tasks are used during the subsequent placement task of constraining the global clock sources. Thus, while the method 200 illustrates the case where select I/O requirements and local clock sources are annealed together, those skilled in the art will appreciate that the placement tasks also can be performed sequentially with each task providing determined placement constraints to the next task, or simultaneously such that all of the aforementioned component types are annealed at the same time and subsequently constrained at the same time.

Continuing to step 215, the cost function for the I/O's and the local clock sources can be generated. The cost function for select I/O, referenced as $C_{selectI/O}$, regulates the placement of I/O's according to select I/O standards and, as such, models the select I/O standards. The cost function $C_{selectI/O}$ penalizes any movement of components that leads to an illegal placement of I/O's with respect to select I/O standards.

The cost function for local clocks, referred to as $C_{LocalClock}$, penalizes any movement of components that produces local clock nets having skews and delays that are larger than predetermined design specifications. Local clock placement is defined as finding appropriate locations for every local clock net in the circuit design and determining locations or region assignments for all components that are either connected to the local clock net or to the source of data to be latched by the local clock source such that all connections related to the local clock are routed with low delays and skews in accordance with the design specifications. The cost function $C_{LocalClock}$ models these goals.

Based upon each of the above cost functions, the following cost function can be used to model select I/O standards and local clock source design tolerances: $C = C_{selectI/O} + C_{LocalClock}$.

In step 220, the I/O's and the local clock sources can be annealed using the above cost function. As the annealing process continues through repeated iterations, the cost function C guides the annealer toward a select I/O compliant and local clock source legal solution. The I/O's are constrained to particular banks of the circuit design and the local clock sources are assigned to particular physical locations on the circuit design. The annealer determines appropriate locations for every local clock net in the circuit design.

The annealer continues to iterate until it converges upon a solution. Those skilled in the art will recognized, however, that in some cases the annealer may not converge upon a solution. If the annealer does not converge upon a solution, an error condition can be generated and the method can end. Such can be the case in situations where the annealer does not converge upon a solution after a predetermined time period or after a predetermined number of iterations.

In step 225, as the I/O's and the local clock sources have been assigned to particular locations in the circuit design, the annealer seeks to determine location assignments for all components connected to the local clock net or the sources of data to be latched by the clock such that all connections related to the local clock sources are routed with delay and skews that do not exceed predetermined design tolerances. In other words, the local clock loads are assigned or constrained to particular windows, or subdivisions of windows referred to as regions, of the circuit design so that connections between the local clock loads and the local clock sources meet the specified design tolerances. A further description of placement of local clock loads within a particular window is described in co-pending U.S. patent application titled "AUTOMATED LOCAL CLOCK PLACEMENT FOR FPGA DESIGNS" by Qiang Wang, et.

al., filed concurrently with this application, and which is herein incorporated by reference.

In step 230, the cost function for the global clocks is determined. Additionally, the local clock placer determines an initial placement for the global clock sources. The cost function for the global clocks reflects all of the predetermined clock rules that must be obeyed and all of the constraints that have been determined and imposed by each previous stage or task.

More particularly, global clock source placement includes the placement of various global clock source types such as, clock multiplexers, clock managers, and global clock I/O's into available locations for each type of global clock source. The above three types of components have dedicated connections between one another which ensure that the fastest signal routing is used to connect the various components. As such, only certain placement configurations of the aforementioned global clock source types allow the use of the dedicate signal routes. The global clock cost function models the placement configurations between various global clock source types by penalizing configurations that forbid the use of dedicated connections.

In step 235, the global clock sources are annealed to assign locations to each global clock source. The annealer begins determining a final placement for the global clock sources using the initial global clock placement as a baseline. As noted, the annealer determines a placement for each global clock source so that interconnects between global clock sources can be routed with minimum delays. Additionally, the annealer assigns locations to the global clock sources so that all previously determined constraints are obeyed and no clock rules are violated.

The clock rules specify placement configurations that allow the global clock sources to use the dedicated routing resources allocated for the circuit design. For example, according to one embodiment of the present invention, there can be 16 locations on a chip where the clock multiplexer can be placed and 4 locations where a clock manager can be placed. Only certain placement configurations of the clock manager and the clock multiplexer, however, allow usage of the dedicated routing resources.

Thus, when annealing the global clock sources, all moves that violate any clock constraints are penalized. Only those moves that do not violate local clock placement constraints are allowed. In this manner, the cost function guides the annealer toward a solution that is legal with respect to all clock rules, obeys all select I/O standards, and obeys local clock constraints.

As noted with respect to step 220, if the annealer does not converge upon a solution, an error condition can be generated and the method can end. The annealer can be allowed to iterate a predetermined number of times or for a predetermined amount of time before terminating without converging upon a placement solution for the circuit design.

In step 240, constraints for the global clock loads can be determined. Once the global clock sources have been assigned to particular positions, the loads of the global clock sources can be assigned to particular windows or regions of the circuit design. The loads of the global clocks are constrained such that no clock window and/or region includes loads for a pair of conflicting global clocks.

In illustration, a clock region represents a portion of a chip, typically approximating 1/16 to 1/4 of the total area of the chip depending upon the particular device. This restriction arises in particular circuit design architectures utilizing paired global clock sources. In particular chip architectures, clock multiplexer locations can be divided into pairs. If, for example, there are 16 possible locations where a clock multiplexer can be placed in a circuit design, 8 possible pairs exist. If two clock multiplexers are placed into a pair of these multiplexer locations, only one of the clock multiplexers can drive the loads present in such a region of the circuit design. No single region can have components that are driven by both pairs of clock multiplexers. This situation can be avoided by placing one multiplexer in one pair, leaving the other pair empty, and placing the other multiplexer in another pair.

The clock placer has a significant degree of freedom in placing global clock buffers and constrains the loads to particular circuit windows and/or regions while obeying constraints relating to select I/O, global clock sources, and local clock sources.

After step 240, the method can end. A detailed placement can be implemented to follow the method 200 which can place remaining logic components of the circuit design. An embodiment of present invention provides a method, system, and apparatus for placing clocks and I/O's of a circuit design as well as constraining the loads of the clocks to particular portions of the circuit design.

In accordance with an embodiment of the present invention disclosed herein, I/O's, local clock sources and loads, as well as global clock sources and loads can be placed such that each task is performed without violating constraints determined during previously performed tasks. The resulting placement complies with select I/O requirements as well as local and global clock source constraints.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of placing a circuit design comprising the steps of:
    (a) assigning initial locations on an integrated circuit to inputs and outputs of the circuit design;
    (b) selecting a component type used in the circuit design;
    (c) generating a cost function corresponding to the inputs and outputs and the selected component type;
    (d) annealing the selected component type using the cost function;

(e) determining location constraints for the inputs and outputs and the selected component type according to said step (d); and (f) repeating steps (b)–e) for additional component types such that location constraints determined for each additional component type do not violate location constraints determined for prior component types.

2. The method of claim 1, wherein the at least one component type is selected from a group consisting of inputs and outputs, local clock sources, and global clock sources.

3. The method of claim 1, wherein the selected component type includes inputs and outputs or local clock sources, and wherein the additional component types include global clock sources.

4. The method of claim 3, said step (d) further comprising the step of assigning locations to global clock sources.

5. The method of claim 4, said step (e) further comprising the step of constraining loads of global clock sources to windows of the integrated circuit.

6. The method of claim 1, said step (d) further comprising the step of assigning individual inputs and outputs to input/output banks of the integrated circuit.

7. The method of claim 1, said step (d) further comprising the step of assigning locations to local clock sources.

8. The method of claim 7, said step (e) further comprising the step of constraining loads of local clock sources to windows of the integrated circuit.

9. A method of placing a circuit design comprising the steps of:
(a) assigning initial locations on an integrated circuit to inputs and outputs of the circuit design;
(b) selecting at least two different component types used in the circuit design;
(c) generating a cost function corresponding to the inputs and outputs and each selected component type;
(d) annealing the selected component types of the circuit design simultaneously using the cost function; and
(e) determining location constraints for the circuit design according to said step (d).

10. The method of claim 9, said step (b) further comprising the step of selecting inputs and outputs, local clock sources, and global clock sources.

11. The method of claim 10, said step (d) further comprising the steps of:
assigning individual inputs and outputs to input/output banks of the integrated circuit;
assigning locations to local clock sources; and
assigning locations to global clock sources.

12. The method of claim 11, said step (e) further comprising the steps of:
constraining loads of local clock sources to windows of the integrated circuit; and
constraining loads of global clock sources to windows of the integrated circuit.

13. A system for placing a circuit design comprising the steps of:
means for assigning initial locations on an integrated circuit to inputs and outputs of the circuit design;
means for selecting a component type used in the circuit design;
means for generating a cost function corresponding to the inputs and outputs and the selected component type;
means for annealing the inputs and outputs and the selected component type using the cost function;
means for determining location constraints for the selected component type according to said annealing step; and means for causing said means for assigning, means for selecting, means for generating, means for annealing, and means for determining to operate on additional component types such that location constraints determined for each additional component type do not violate design constraints determined for prior component types.

14. The system of claim 13, wherein the component types are selected from the group consisting of inputs and outputs, local clock sources, and global clock sources.

15. The system of claim 14, wherein the selected component types include inputs and outputs and local clock sources.

16. The system of claim 15, wherein the additional component types include global clock sources.

17. The system of claim 16, wherein said means for annealing further comprise means for assigning locations to global clock sources.

18. The system of claim 15, wherein said means for annealing further comprise means for assigning individual inputs and outputs to input/output banks of the circuit design.

19. The system of claim 15, wherein said means for annealing further comprise means for assigning locations to local clock sources.

20. The system of claim 19, wherein said means for determining further comprise means for constraining loads of local clock sources to windows of the integrated circuit.

21. The system of claim 17, wherein said means for determining further comprise means for constraining loads of global clock sources to windows of the integrated circuit.

22. A system for placing a circuit design comprising the steps of:
means for assigning initial locations on an integrated circuit to inputs and outputs of the circuit design;
means for selecting at least two different component types used in the circuit design;
means for generating a cost function corresponding to the inputs and outputs and each selected component type;
means for annealing the inputs and outputs and the selected component types of the circuit design simultaneously using the cost function; and
means for determining location constraints for the circuit design according to said annealing step.

23. The system of claim 22, wherein said means for selecting select inputs and outputs, local clock sources, and global clock sources.

24. The system of claim 23, wherein said means for annealing further comprise:
means for assigning individual inputs and outputs to input/output banks of the integrated circuit;
means for assigning locations to local clock sources; and
means for assigning locations to global clock sources.

25. The system of claim 24, wherein said means for determining further comprise:
means for constraining loads of local clock sources to windows of the integrated circuit; and
means for constraining loads of global clock sources to windows of the integrated circuit.

26. A machine readable storage, having stored thereon a computer program having a plurality of code sections executable by a machine for causing the machine to perform the steps of:
(a) assigning initial locations on an integrated circuit to inputs and outputs of the circuit design;
(b) selecting component type used in the circuit design;

(c) generating a cost function corresponding to the inputs and outputs and the selected component type;

(d) annealing the inputs and outputs and the selected component type using the cost function;

(e) determining location constraints for the inputs and outputs and the selected component type according to said step (d); and (f) repeating steps (b)–(e) for additional component types such that location constraints determined for each additional component type do not violate location constraints determined for prior component types.

27. The machine readable storage of claim 26, wherein the component types are selected from the group consisting of inputs and outputs, local clock sources, and global clock sources.

28. The machine readable storage of claim 27, wherein the selected component types include inputs and outputs and local clock sources.

29. The machine readable storage of claim 28, wherein the additional component types include global clock sources.

30. The machine readable storage of claim 29, said step (d) further comprising the step of assigning locations to global clock sources.

31. The machine readable storage of claim 30, said step (e) further comprising the step of constraining loads of global clock sources to windows of the integrated circuit.

32. The machine readable storage of claim 28, said step (d) further comprising the step of assigning individual inputs and outputs to input/output banks of the integrated circuit.

33. The machine readable storage of claim 28, said step (d) further comprising the step of assigning locations to local clock sources.

34. The machine readable storage of claim 33, said step (e) further comprising the step of constraining loads of local clock sources to windows of the integrated circuit.

35. A machine readable storage, having stored thereon a computer program having a plurality of code sections executable by a machine for causing the machine to perform the steps of:

(a) assigning initial locations on an integrated circuit to inputs and outputs of the circuit design;

(b) selecting at least two different component types used in the circuit design;

(c) generating a cost function corresponding to the inputs and outputs and each selected component type;

(d) annealing the inputs and outputs and the selected component types of the circuit design simultaneously using the cost function; and (e) determining location constraints for the circuit design according to said step (d).

36. The machine readable storage of claim 35, said step (b) further comprising the step of selecting inputs and outputs, local clock sources, and global clock sources.

37. The machine readable storage of claim 36, said step (d) further comprising the steps of:

assigning individual inputs to input/output banks of the circuit design;

assigning locations to local clock sources; and assigning locations to global clock sources.

38. The machine readable storage of claim 37, said step (e) further comprising the steps of:

constraining loads of local clock sources to windows of the integrated circuit; and constraining loads of global clock sources to windows of the integrated circuit.

* * * * *